(12) United States Patent
Wang

(10) Patent No.: US 11,302,884 B2
(45) Date of Patent: Apr. 12, 2022

(54) ORGANIC LIGHT-EMITTING DIODE DISPLAY PANEL AND METHOD OF FABRICATING SAME

(71) Applicant: WUHAN CHINA STAR OPTOELECTRONICS SEMICONDUCTOR DISPLAY TECHNOLOGY CO., LTD., Hubei (CN)

(72) Inventor: Bo Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 289 days.

(21) Appl. No.: 16/613,391

(22) PCT Filed: Sep. 18, 2019

(86) PCT No.: PCT/CN2019/106506
§ 371 (c)(1),
(2) Date: Nov. 13, 2019

(87) PCT Pub. No.: WO2020/244095
PCT Pub. Date: Dec. 10, 2020

(65) Prior Publication Data
US 2021/0408425 A1    Dec. 30, 2021

(30) Foreign Application Priority Data

Jun. 6, 2019  (CN) .......................... 201910488854.1

(51) Int. Cl.
*H01L 51/50*  (2006.01)
*H01L 51/56*  (2006.01)

(52) U.S. Cl.
CPC ...... *H01L 51/5036* (2013.01); *H01L 51/5072* (2013.01); *H01L 51/5092* (2013.01); *H01L 51/5096* (2013.01); *H01L 51/56* (2013.01)

(58) Field of Classification Search
CPC .. H01L 51/5036; H01L 51/5096; H01L 51/56
See application file for complete search history.

(56) References Cited

U.S. PATENT DOCUMENTS

2012/0161172 A1    6/2012   Oyamada
2013/0175508 A1    7/2013   Kwon
(Continued)

FOREIGN PATENT DOCUMENTS

| CN | 102474937 A | 5/2012 |
| CN | 108461641 A | 8/2018 |
| CN | 108598134 A | 9/2018 |

*Primary Examiner* — Anthony Ho

(57) ABSTRACT

The present invention provides an organic light-emitting diode (OLED) display panel, including: an array substrate; an anode disposed on the array substrate; a light-emitting layer disposed on the anode, the light-emitting layer including a red light-emitting sub-layer, a green light-emitting sub-layer, and a blue light-emitting sub-layer in a pixel region; and a cathode disposed on the light-emitting layer, wherein the pixel region at least corresponding to the red light-emitting sub-layer and the green light-emitting sub-layer is not provided with a hole blocking layer.

15 Claims, 3 Drawing Sheets

(56) References Cited

U.S. PATENT DOCUMENTS

| | | | |
|---|---|---|---|
| 2014/0054556 A1* | 2/2014 | Park | H01L 51/56 257/40 |
| 2014/0363913 A1 | 12/2014 | Park et al. | |
| 2019/0372060 A1 | 12/2019 | Li et al. | |

* cited by examiner

ORGANIC LIGHT-EMITTING DIODE DISPLAY PANEL AND METHOD OF FABRICATING SAME

BACKGROUND OF INVENTION

Field of Invention

The present invention relates to the field of display technologies, and in particular to an organic light-emitting diode (OLED) display panel and a method of fabricating the same.

Description of Prior Art

Organic light-emitting diode (OLED) screens, which are widely used in the display field, generally adopt a multilayered device structure, which sequentially includes a total reflection anode substrate, a hole injection layer, a hole transport layer, an electron blocking layer, and a light-emitting layer, a hole blocking layer, an electron transport layer, an electron injecting layer, a cathode, and the like. In the prior art, at least one of the red, green, and blue light-emitting layers includes a hole-type material as a host material, and thus a common hole blocking layer is required between the light-emitting layer and the electron transport layer to prevent holes or excitons in the light-emitting layer from diffusing into the electron transport layer, causing leakage current or exciton annihilation, thereby reducing light-emitting efficiency.

Working voltage and light-emitting efficiency are important indicators for evaluating an organic light-emitting diode (OLED) display. Due to the low mobility of the common hole blocking layer, operating voltage of the red pixel and operating voltage of the green pixel in the OLED display panel are close to each other at a same current density The operating voltage of blue pixel is relatively higher, and thus causes pixel crosstalk in the OLED display panel at low gray levels.

SUMMARY OF INVENTION

The present invention provides an organic light-emitting diode (OLED) display panel and a method of fabricating the same, to solve the problem that in the existing OLED display panel, since a common hole blocking layer having a lower mobility is disposed on the light-emitting layer, and thus at the same current, compared to the operating voltage of the red pixel and the operating voltage of the green pixel, the operating voltage of blue pixel is relatively higher, resulting in the pixel crosstalk in the OLED display panel at low gray levels.

In order to solve the above problems, the technical solution provided by the present invention is as follows:

The present invention also provides an organic light-emitting diode (OLED) display panel, including an array substrate; an anode disposed on the array substrate; a light-emitting layer disposed on the anode, the light-emitting layer including a red light-emitting sub-layer, a green light-emitting sub-layer, and a blue light-emitting sub-layer in a pixel region; and a cathode disposed on the light-emitting layer, wherein the pixel region at least corresponding to the red light-emitting sub-layer and the green light-emitting sub-layer is not provided with a hole blocking layer; and the OLED display panel further includes a hole injection layer, a hole transport layer, and an electron blocking layer sequentially disposed between the anode and the light-emitting layer, and an electron transport layer and an electron injection layer sequentially disposed between the light-emitting layer and the cathode.

In an embodiment of the present invention, the pixel region corresponding to the blue light-emitting sub-layer is not provided with a hole blocking layer.

In an embodiment of the present invention, the pixel region corresponding to the blue light-emitting sub-layer is provided with a hole blocking layer.

In an embodiment of the present invention, the hole blocking layer is disposed between the blue light-emitting sub-layer and the electron transporting layer.

In an embodiment of the present invention, the hole blocking layer is made of an electronic blue light host material.

In an embodiment of the present invention, the hole blocking layer is made of an organic small molecule material including ruthenium, biguanide, naphthalene, or anthracene as a core.

In an embodiment of the present invention, the bole blocking layer has a thickness of 5 to 20 nm.

In an embodiment of the present invention, each of host materials of the red light-emitting sub-layer, the green light-emitting sub-layer, and the blue light-emitting sub-layer is independently selected from one of an electronic material and a bipolar material.

The present invention also provides an organic light-emitting diode (OLED) display panel, including an array substrate; an anode disposed on the array substrate; a light-emitting layer disposed on the anode, the light-emitting layer including a red light-emitting sub-layer, a green light-emitting sub-layer, and a blue light-emitting sub-layer in a pixel region; and a cathode disposed on the light-emitting layer, wherein the pixel region at least corresponding to the red light-emitting sub-layer and the green light-emitting sub-layer is not provided with a hole blocking layer.

In an embodiment of the present invention, the pixel region corresponding to the blue light-emitting sub-layer is not provided with a hole blocking layer.

In an embodiment of the present invention, the OLED display panel further includes a hole injection layer, a hole transport layer, and an electron blocking layer sequentially disposed between the anode and the light-emitting layer, and an electron transport layer and an electron injection layer sequentially disposed between the light-emitting layer and the cathode.

In an embodiment of the present invention, the pixel region corresponding to the blue light-emitting sub-layer is provided with a hole blocking layer.

In an embodiment of the present invention, the OLED display panel further includes a hole injection layer, a hole transport layer, and an electron blocking layer sequentially disposed between the anode and the light-emitting layer, and an electron transport layer and an electron injection layer sequentially disposed between the light-emitting layer and the cathode, wherein the hole blocking layer is disposed between the blue light-emitting sub-layer and the electron transport layer.

In an embodiment of the present invention, the hole blocking layer is made of an electronic blue light host material.

In an embodiment of the present invention, the hole blocking layer is made of an organic small molecule material including ruthenium, biguanide, naphthalene, or anthracene as a core.

In an embodiment of the present invention, the hole blocking layer has a thickness of 5 to 20 nm.

In an embodiment of the present invention, each of the host materials of the red light-emitting sub-layer, the green light-emitting sub-layer, and the blue light-emitting sub-layer is independently selected from one of an electronic material and a bipolar material.

The present invention also provides a method of fabricating an organic light-emitting diode (OLED) display panel, including the following steps: S10, providing an array substrate, and preparing an anode on the array substrate; S20, preparing a light-emitting layer on the anode, the light-emitting layer including a red light-emitting sub-layer, a green light-emitting sub-layer, and a blue light-emitting sub-layer in a pixel region; S30, preparing a hole blocking layer above the pixel region corresponding to the blue light-emitting sub-layer; and S40, preparing a cathode on the hole blocking layer.

In an embodiment of the present invention, the hole blocking layer is made of an electronic blue light host material.

In an embodiment of the present invention, the hole blocking layer has a thickness of 5 to 20 nm.

In an embodiment of the present invention, the hole blocking layer is made of an electronic blue light host material.

In an embodiment of the present invention, the hole blocking layer is made of an organic small molecule material including ruthenium, biguanide, naphthalene, or anthracene as a core.

The present invention has the beneficial effects that the common hole blocking layer having the lower mobility is excluded, so that no hole blocking layer is formed on the blue light-emitting sub-layer, or the electronic blue light host material is disposed on the blue light-emitting sub-layer as the hole blocking layer, not only reducing the working voltage of the blue pixel, but also improving the current efficiency of the blue pixel, without influence on performance of the red and green devices. On the other hand, the structure of the OLED display panel can be simplified, and production cost can be reduced.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
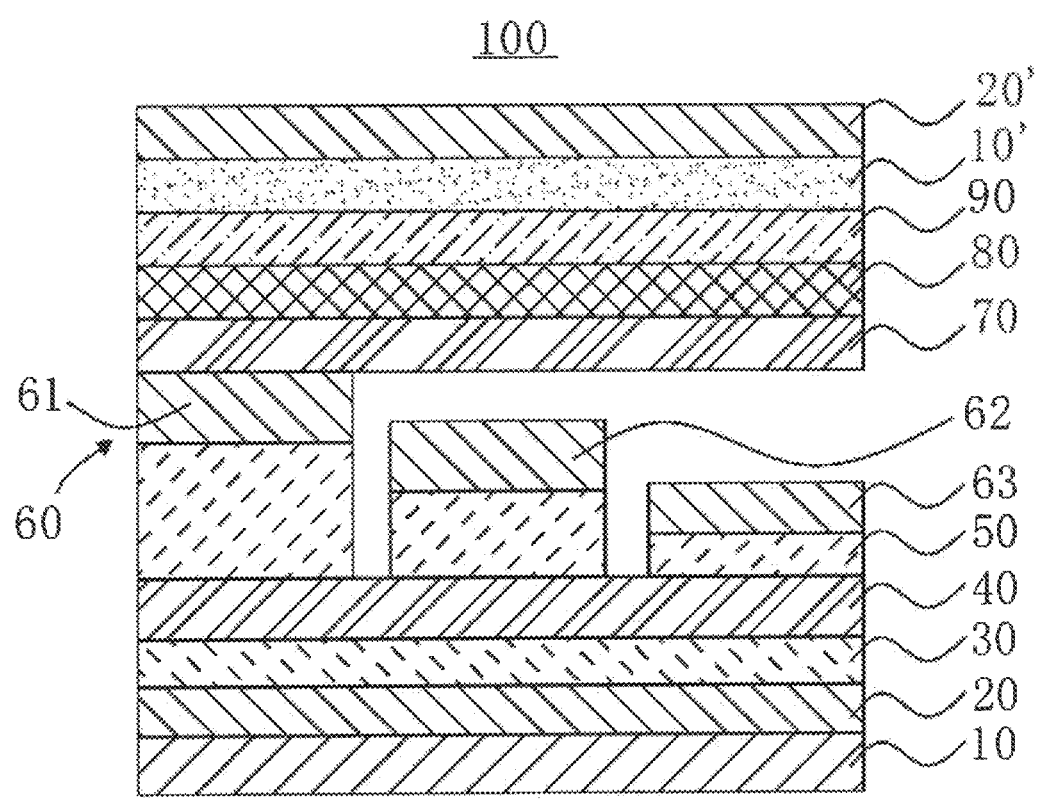
FIG. 1 is a schematic structural diagram of an organic light-emitting diode (OLED) display panel according to an embodiment of the present invention.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the figures, structurally similar elements are denoted by the same reference numerals The present invention aims to solve the problem of the existing OLED display panel that since at least one of the red, green, and blue light-emitting layers includes a hole-type material as a host material, a common hole blocking layer having a lower mobility is required between the light-emitting layer and the electron transport layer to prevent holes or excitons in the light-emitting layer from diffusing into the electron transport layer, and at the same current, compared to the operating voltage of the red pixel and the operating voltage of the green pixel, the operating voltage of blue pixel is relatively higher, resulting in the pixel crosstalk in the OLED display panel at low gray levels.

As shown in FIG. 1, an embodiment of the present invention provides an organic light-emitting diode (OLED) display panel 100 including an array substrate 10, an anode 20 disposed on the array substrate 10, a light-emitting layer 60 disposed on the anode 20, and a cathode 90 disposed on the light-emitting layer 60.

The light-emitting layer 60 includes a red light-emitting sub-layer 61, a green light-emitting sub-layer 62, and a blue light-emitting sub-layer 63 disposed in a corresponding pixel region.

The OLED display panel 100 further includes a hole injection layer 30, a hole transport layer 40, and an electron blocking layer 50, which are sequentially disposed between the anode 20 and the light-emitting layer 60, and the electron blocking layer 50 is disposed corresponding to the light-emitting sub-layers of a corresponding pixel region.

The OLED display panel 100 further includes an electron transport layer 70 and an electron injection layer 80 which are sequentially disposed between the light-emitting layer 60 and the cathode 90.

Since at least one of the existing red, green, and blue light-emitting layers includes a hole-type material as a host material, a common hole blocking layer having a lower mobility is required between the light-emitting layer and the electron transport layer to prevent holes or excitons in the light-emitting layer from diffusing into the electron transport layer, and at the same current, compared to the operating voltage of the red pixel and the operating voltage of the green pixel, the operating voltage of blue pixel is relatively higher, resulting in the pixel crosstalk in the OLED display panel at low gray levels.

Therefore, each of host materials of the red light-emitting sub-layer 61, the green light-emitting sub-layer 62, and the blue light-emitting sub-layer 63 is independently selected from one of an electronic material and a bipolar material, so that the light-emitting recombination center is located away from the center of the electron transport layer 70 or the light-emitting layer 60, and therefore it is not necessary to provide a common hole transport layer.

Specifically, none of the pixel regions corresponding to the red light-emitting sub-layer 61, the green light-emitting sub-layer 62, and the blue light-emitting sub-layer 63 is provided with a hole blocking layer.

Figure 2:
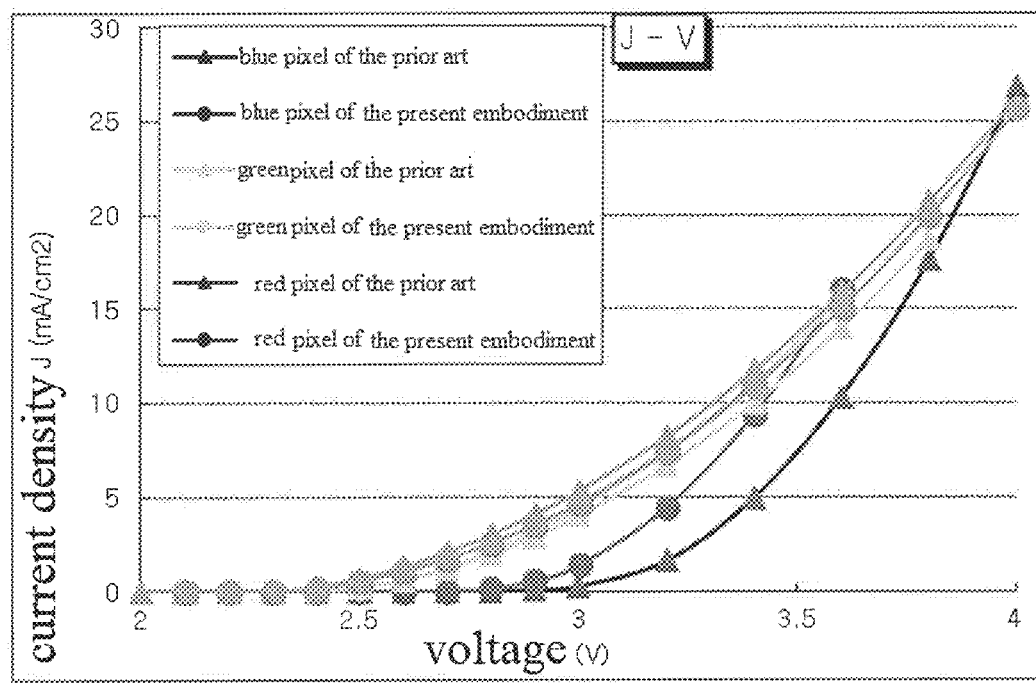
FIG. 2 is a comparison diagram of relationships between current densities and voltages of pixels respectively according to an embodiment of the present invention and the prior art.
Figure 3:
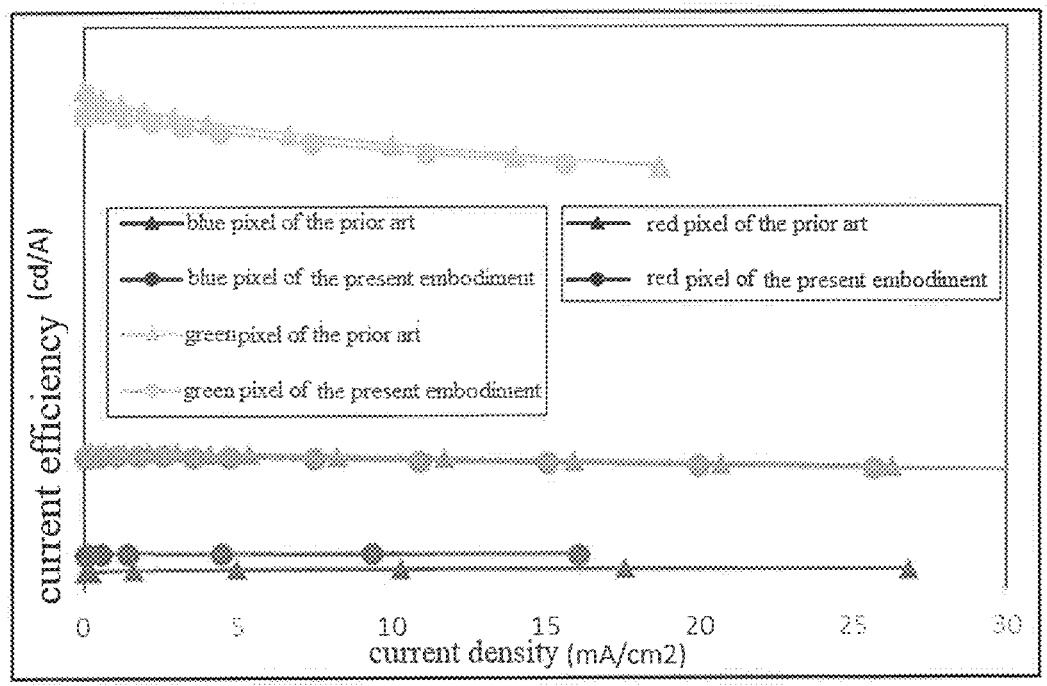
FIG. 3 is a comparison diagram of relationships between current efficiency and current density of pixels respectively according to an embodiment of the present invention and the prior art.

As shown in FIG. 2, as compared with the prior art having a common hole blocking layer, in this embodiment, after removing the common hole blocking layer, the voltages of the green pixel and the red pixel are hardly impacted, and at the same current density, the operating voltage of the blue pixel in this embodiment is significantly reduced. As shown in FIG. 3, at the same current density, the current efficiency of the green pixel and the red pixel is hardly impacted, and the current efficiency of the blue pixel in this embodiment is also improved. In addition, the removal of the common hole blocking layer is also advantageous for simplifying the structure of the OLED device and reducing the production cost of the OLED display panel.

Figure 4:
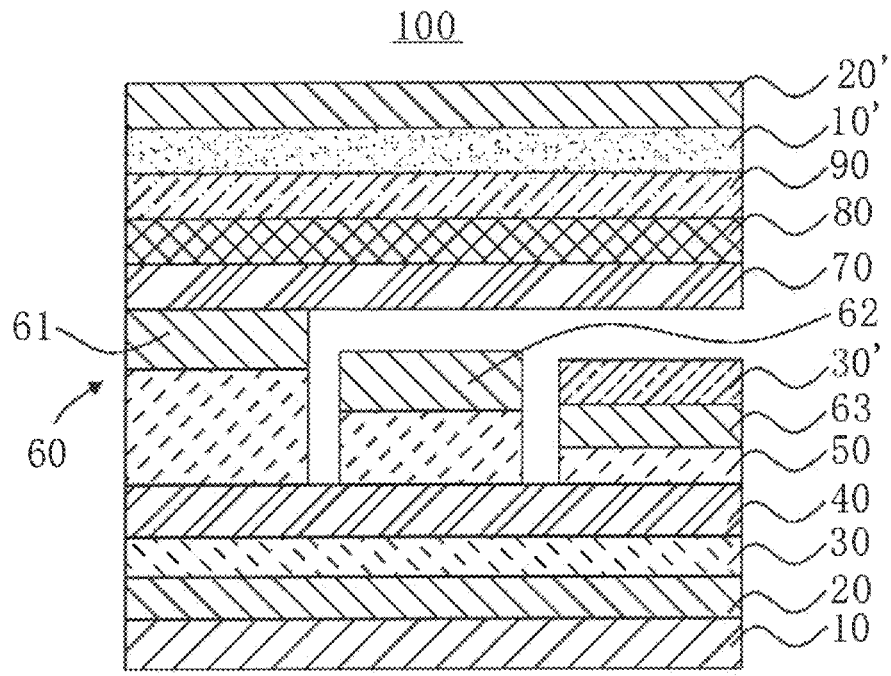
FIG. 4 is a schematic structural diagram of an organic light-emitting diode (OLED) display panel according to another embodiment of the present invention.

As shown in FIG. 4, on the basis of this embodiment, a hole blocking layer 30' may be further disposed in the pixel region corresponding to the blue light-emitting sub-layer 63, that is, the hole blocking layer 30' is disposed between the blue light-emitting sub-layer 63 and the electron transport layer 70, and the hole blocking layer 30' is disposed corresponding to the blue light-emitting sub-layer 63, while no hole blocking layer 30' is provided corresponding to the red light-emitting sub-layer 61 and the green light-emitting sub-layer 62.

The hole blocking layer 30' has a thickness of 5 to 20 nm. The hole blocking layer 30' is made of an electronic blue light host material having a higher mobility compared to the common hole blocking layer in the prior art, thereby reducing the operating voltage of the blue sub-pixel and increasing the current efficiency of the blue sub-pixel.

Specifically, the hole blocking layer 30' is made of an organic small molecule material including ruthenium, biguanide, naphthalene, or anthracene as a core.

The OLED display panel 100 may further include a coupling light-emitting layer 10' and an encapsulating layer 20', which are sequentially disposed on the cathode 90, wherein the coupling light-emitting layer 10' is used to increase the light extraction rate of the OLED light-emitting device, and the layer encapsulating layer 20' is used to protect the OLED light-emitting device from erosion of water and oxygen.

Figure 5:
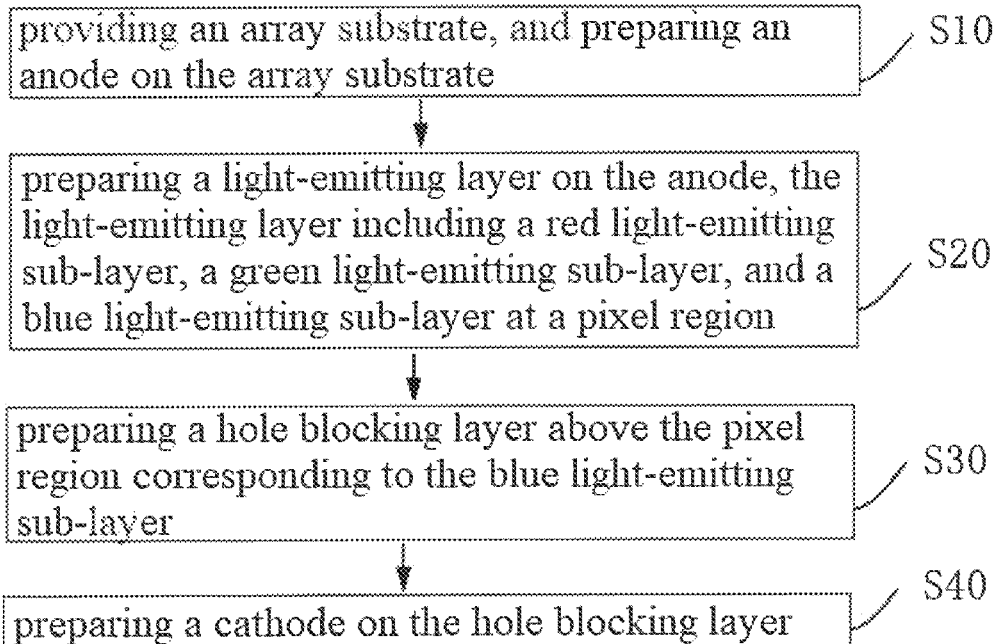
FIG. 5 is a flow chart of steps of a method of fabricating an organic light-emitting diode (OLED) display panel according to an embodiment of the present invention.

As shown in FIG. 5, an embodiment of the present invention further provides a method of fabricating an organic light-emitting diode (OLED) display panel 100, including the following steps:

S10, providing an array substrate 10, and preparing an anode 20 on the array substrate 10;

S20, preparing a light-emitting layer 60 on the anode 20, the light-emitting layer 60 including a red light-emitting sub-layer 61, a green light-emitting sub-layer 62, and a blue light-emitting sub-layer 63 in a pixel region;

S30, preparing a hole blocking layer 30' above the pixel region corresponding to the blue light-emitting sub-layer 63; and S40, preparing a cathode 90 on the hole blocking layer 30'.

The fabrication method of the embodiment of the present invention will be described in detail below.

First, an anode 20 is prepared on the array substrate 10, the array substrate 10 includes an array of thin film transistor devices, and the anode 20 has a composite layer structure, which sequentially includes a first indium tin oxide layer, a silver metal layer, and a second indium tin oxide layer.

Then, a hole injecting layer 30 and a hole transporting layer 40 are sequentially deposited on the anode by vacuum evaporation using an open mask, wherein a material of the hole transporting layer 40 is at least one of 2T-NATA, NPB, and TAPC, and the hole transport layer 40 has a thickness of 40 to 150 nm.

Next, an electron blocking layer 50 is deposited on the corresponding pixel region by a fine metal mask, wherein the electron blocking layer 50 is made of an organic small molecule material. Then, the light-emitting sub-layer is evaporated on the corresponding pixel region of the electron blocking layer 50 through a fine metal mask.

After the evaporation of the blue light-emitting sub-layer 63 is completed, an electron-type blue host light-emitting material is evaporated on the blue light-emitting sub-layer 63 as a hole blocking layer by using the same mask as that used for the blue light-emitting sub-layer 63. Specifically, the electron-type blue host light-emitting material may be an organic small molecule material including ruthenium, biguanide, naphthalene, anthracene or the like as a core, and the hole blocking layer 30' has a thickness of 5 to 20 nm.

Thereafter, the electron transport layer 70 and the electron injection layer 80 are sequentially vacuum-evaporated on the light-emitting layer 60 by using an open mask, wherein a material of the electron transport layer 70 is at least one of TPBi, Bphen, and TmPyPB, having a thickness of 20-80 nm, and a material of the electron injecting layer 80 may be a reactive metal such as Yb or Mg.

Thereafter, a cathode 90 is prepared on the electron injection layer 80, and a material of the cathode 90 may be one or a combination of Yb, Ca, Mg, and Ag.

The fabrication method of this embodiment of the present invention further includes sequentially preparing a coupling light-emitting layer 10' and an encapsulation layer 20' on the cathode, and a material of the coupling light-emitting layer 10' is a high refractive index organic small molecular material, such as a hole transport type material. The encapsulating layer 20' is made of a material composed of an alternately disposed multilayered inorganic/organic polymers, wherein the inorganic polymer may be one or more of SiNX, SiOX, SiONX, SiCNX, and Al2O3, and the organic polymer may be acrylic, an epoxy resin, or the like.

The present invention has the beneficial effects that the common hole blocking layer having the lower mobility is removed, so that no hole blocking layer is formed on the blue light-emitting sub-layer. Alternatively, the electronic blue light host material is disposed on the blue light-emitting sub-layer as the hole blocking layer, which not only reduces the working voltage of the blue pixel, but also improves the current efficiency of the blue pixel, without compromising the performance of the red and green devices. On the other hand, the structure of the OLED display panel can be simplified, and production cost can be reduced.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic light-emitting diode (OLED) display panel, comprising:
   an array substrate;

an anode disposed on the array substrate;
a light-emitting layer disposed on the anode, the light-emitting layer comprising a red light-emitting sub-layer, a green light-emitting sub-layer, and a blue light-emitting sub-layer in a pixel region; and
a cathode disposed on the light-emitting layer, wherein the pixel region at least corresponding to the red light-emitting sub-layer and the green light-emitting sub-layer is not provided with a hole blocking layer;
the OLED display panel further comprises a hole injection layer, a hole transport layer, and an electron blocking layer sequentially disposed between the anode and the light-emitting layer, and an electron transport layer and an electron injection layer sequentially disposed between the light-emitting layer and the cathode; and
the pixel region corresponding to the blue light-emitting sub-layer is provided with a hole blocking layer.

2. The OLED display panel according to claim 1, wherein the pixel region corresponding to the blue light-emitting sub-layer is not provided with a hole blocking layer.

3. The OLED display panel of claim 1, wherein the hole blocking layer is disposed between the blue light-emitting sub-layer and the electron transporting layer.

4. The OLED display panel of claim 1, wherein the hole blocking layer is made of an electronic blue light host material.

5. The OLED display panel according to claim 4, wherein the hole blocking layer is made of an organic small molecule material comprising ruthenium, biguanide, naphthalene, or anthracene as a core.

6. The OLED display panel according to claim 4, wherein the hole blocking layer has a thickness of 5 to 20 nm.

7. The OLED display panel of claim 1, wherein each of host materials of the red light-emitting sub-layer, the green light-emitting sub-layer, and the blue light-emitting sub-layer is independently selected from one of an electronic material and a bipolar material.

8. An organic light-emitting diode (OLED) display panel, comprising:
an array substrate;
an anode disposed on the array substrate;
a light-emitting layer disposed on the anode, the light-emitting layer comprising a red light-emitting sub-layer, a green light-emitting sub-layer, and a blue light-emitting sub-layer in a pixel region; and
a cathode disposed on the light-emitting layer, wherein the pixel region at least corresponding to the red light-emitting sub-layer and the green light-emitting sub-layer is not provided with a hole blocking layer; and
the pixel region corresponding to the blue light-emitting sub-layer is provided with a hole blocking layer.

9. The OLED display panel according to claim 8, wherein the pixel region corresponding to the blue light-emitting sub-layer is not provided with a hole blocking layer.

10. The OLED display panel according to claim 9, wherein the OLED display panel further comprises a hole injection layer, a hole transport layer, and an electron blocking layer sequentially disposed between the anode and the light-emitting layer, and an electron transport layer and an electron injection layer sequentially disposed between the light-emitting layer and the cathode.

11. The OLED display panel according to claim 8, wherein the OLED display panel further comprises a hole injection layer, a hole transport layer, and an electron blocking layer sequentially disposed between the anode and the light-emitting layer, and an electron transport layer and an electron injection layer sequentially disposed between the light-emitting layer and the cathode, wherein the hole blocking layer is disposed between the blue light-emitting sub-layer and the electron transport layer.

12. The OLED display panel according to claim 8, wherein the hole blocking layer is made of an electronic blue light host material.

13. The OLED display panel according to claim 12, wherein the hole blocking layer is made of an organic small molecule material comprising ruthenium, biguanide, naphthalene, or anthracene as a core.

14. The OLED display panel according to claim 12, wherein the hole blocking layer has a thickness of 5 to 20 nm.

15. The OLED display panel according to claim 8, wherein each of the host materials of the red light-emitting sub-layer, the green light-emitting sub-layer, and the blue light-emitting sub-layer is independently selected from one of an electronic material and a bipolar material.

* * * * *